United States Patent [19]

Beilin et al.

[11] Patent Number: 5,376,586
[45] Date of Patent: Dec. 27, 1994

[54] METHOD OF CURING THIN FILMS OF ORGANIC DIELECTRIC MATERIAL

[75] Inventors: Solomon I. Beilin, San Carlos; Wen-chou V. Wang; William T. Chou, both of Cupertino, all of Calif.

[73] Assignee: Fujitsu Limited, Japan

[21] Appl. No.: 64,224

[22] Filed: May 19, 1993

[51] Int. Cl.$^5$ ............... H01L 21/44; H01L 21/48
[52] U.S. Cl. ............... 437/195; 204/157.64; 522/164
[58] Field of Search ............... 437/195, 928; 148/DIG. 46; 430/296, 330

[56] References Cited

U.S. PATENT DOCUMENTS

| | | | |
|---|---|---|---|
| 4,175,963 | 11/1979 | Crivello | 430/296 |
| 4,339,526 | 7/1982 | Baise et al. | 430/296 |
| 4,594,315 | 6/1986 | Shibue et al. | 430/531 |
| 4,643,910 | 2/1987 | Foutz | 427/10 |
| 4,719,161 | 1/1988 | Kimura et al. | 430/296 |
| 5,024,969 | 6/1991 | Reche | 437/173 |
| 5,057,397 | 10/1991 | Miyabe et al. | 430/270 |
| 5,120,634 | 6/1992 | Kobayashi | 430/296 |

FOREIGN PATENT DOCUMENTS 4-23425  1/1992  Japan ............... 437/928

Primary Examiner—Tom Thomas
Assistant Examiner—Trung Dang
Attorney, Agent, or Firm—McCubbrey, Bartels & Ward

[57] ABSTRACT

A method of curing an organic dielectric layer, such as polyimide, used in a multichip module is disclosed. The method comprises heating the uncured polyimide layer to a temperature above its glass transition temperature, and irradiating the layer with a uniform flux of electrons, as in an e-beam apparatus. The process reduces deterioration at the interface between the dielectric films and the metal layers which when high temperature thermal curing is utilized, and reduces the stress of the resulting film. Multiple dielectric layers can be applied in this manner.

9 Claims, 2 Drawing Sheets

METHOD OF CURING THIN FILMS OF ORGANIC DIELECTRIC MATERIAL

FIELD OF THE INVENTION

The present invention relates to the application of thin films of organic dielectric materials used in the fabrication of substrates for holding electronic devices, and is specifically related to a method of curing such films.

BACKGROUND OF THE INVENTION

Thin films of organic dielectric materials, such as polyimides, have found widespread use in the electronics industry in a variety of applications. One area in which thin films of polyimide and organic dielectric materials have found extensive use is in the fabrication of packaging modules for carrying one or more integrated circuit ("IC") chips. A plurality of individual IC chips may be disposed upon a so-called multichip module comprising a substrate upon which the chips are mounted. The substrate will typically contain various signal, power and ground lines for connection to the IC chips mounted thereon. The substrate may also comprise passive components such as bypass capacitors and terminal resistors.

In order to include the necessary power, signal and ground lines, (and to include, if applicable, passive components), the substrates used in multichip modules generally comprise a plurality of metal layers separated by dielectric material. Initially, most multichip modules were made of co-fired ceramic materials. In the last several years, thin-film packaging technologies have become more significant for fabricating multichip modules, particularly so-called copper/polyimide based modules. Thin film IC packages of this type typically comprise alternating layers of thin films of patterned copper and polyimide materials, usually on a thick base support substrate. Most recently, multichip modules combining both ceramic and thin-film technologies have been developed. A general discussion of both types of technologies may be found in Chapters 7 and 9 of *Microelectronics Packaging Handbook*, R. Tummala, et al. (eds.), (1989, van Nostrand Reinhold, New York).

The term polyimide, although sometimes used in a context which suggests a particular compound, actually describes a class of ring-chain resin polymers containing imide fragments. Polyimides are particularly useful because they have high temperature tolerance, good mechanical and chemical properties, low dielectric constant, and are relatively easily formed into a film which is highly uniform in thickness. While polyimides are the most commonly used class of dielectric materials used in thin film packages, other organic materials may also be used. Other organic materials that have been used or proposed for use in multichip modules include bensocyclobutenes, polyphenylquinoxalines, and various oligomers. The curing and polymerization processes for such materials are similar to the process used with polyimides.

Typically, a layer of the desired organic dielectric material (or its precursor) is applied to the base substrate (upon which other layers may have already been formed) in the liquid state. The layer is then hardened (polymerized or immidized) by using a curing process. The curing process normally involves two aspects, removal of the solvent carrier and imidization or cross-linking of the remaining material. The most common method of curing polyimides, and other thin film organic dielectric layers, is by heating them at an elevated temperature for a relatively long time. Provided that the curing temperature is sufficiently high, the heat curing process fulfills both aspects of the process, i.e., the solvent base is removed by volatilization at high temperature, and the immidization process also occurs at high temperature. As is well-known in the art, for temperature-induced immidization to occur, the curing temperature must be above the glass transition temperature of the polyimide material being used. As is also well-known in the art, the glass transition temperature increases with the degree of curing. For example, the initial glass transition temperature of a solvent-free uncured polyimide film may be approximately 150° C., while the glass transition temperature of the same film rises to above 300° C. after the film is cured.

Thus, a typical polyimide, as applied, may consist of a polyamic acid or polyamic ester dissolved in a solvent of N-Methyl-2-pyrrolidone. The latter has a boiling point of about 202° C. After solvent removal, the uncured polymeric material has a glass transition temperature of approximately 150°–250° C. However, for the reasons described below, the polymerization reaction must, typically be conducted at above 350° C., which is the glass transition temperature of the cured film.

As noted, the heat-curing technique generally in use in connection with thin films of organic dielectric materials used in multichip modules involves heating the layer to a high temperature, typically about 400° C., for a relatively long period of time (one to four hours per layer). This process limits the maximum number of organic film layers that can be used due to the degradation of the polymer/metal interfaces caused by the high temperature curing.

Another problem with high temperature curing of polyimide and other organic layers arises from the mismatch between the thermal coefficients of expansion (TCEs) of the organic layers and the interposed metal layers and the base substrate. If the system is cured at a temperature greater than the final glass transition temperature of the organic film, the stress at the interface between the film and the metal layer will be zero at the final glass transition temperature, i.e., the film will be fully relaxed at the glass transition temperature. As the layers are cooled down below this temperature, stress builds up due to the mismatch between the TCEs of the layers, causing bowing of the substrate. This effect limits the size of the multichip module and choice of materials used to create it.

In addition, if the polyimide or other organic material layer is used in connection with active devices, such devices may be damaged or destroyed by the high temperatures used in the curing process.

U.S. Pat. No. 5,024,969, entitled *Hybrid Circuit Structure Fabrication Methods Using High Energy Electron Beam Curing*, issued Jun. 18, 1991 to Reche, discloses a technique for curing polyimide layers in a multichip module using e-beam irradiation of the uncured layer. Under the preferred process described in the '969 patent, the polyimide film is cured at room temperature. In an alternate embodiment, the curing may be conducted at the anticipated operating temperature of the multichip module, so long as the curing temperature is lower than the glass transition temperature of the uncured polyimide layer. However, the '969 patent recognizes that the quality of a polyimide layer cured at room temperature is poor due to inferior adhesion to the metal layers. It is also believed that films cured in this manner have poor chemical resistance. To solve the problem of poor adhesion, the '969 patent suggests a post-cure bake of the overall multichip module at a temperature less than the transition temperature of the polyimide. It is assumed that the problem of poor adhesion arises from the failure, when curing at room temperature, to drive off the solvent used to carry the polyimide, and that the baking step is used to complete the solvent removal. While the process described in the '969 patent is, in some respects, an improvement over the temperature curing technique, it is believed that the quality of the resulting films is still low, and that the post-cure bake step adds unnecessary complexity and added fabrication time.

SUMMARY OF THE INVENTION

Accordingly, it is an object of the present invention to provide a process for curing thin layers of polyimide and other organic dielectrics used in multichip modules without the need to heat the layers to very high temperatures.

Likewise, it is an object of the present invention to provide a process for curing thin films of polymeric materials which results in high quality layers.

It is a further object of the present invention to overcome the prior difficulties with using e-beam irradiation to cure polyimide layers used in multichip modules, and without the need to subsequently bake the cured layer.

These and other objects which will become apparent to those skilled in the art upon reading this specification in conjunction with the drawing and the appended claims, are addressed by the present invention which comprises a process for curing a thin polymer layer by simultaneously irradiating the layer with electrons and heating the layer above the initial glass transition temperature of the polymer.

DETAILED DESCRIPTION

Figure 1:
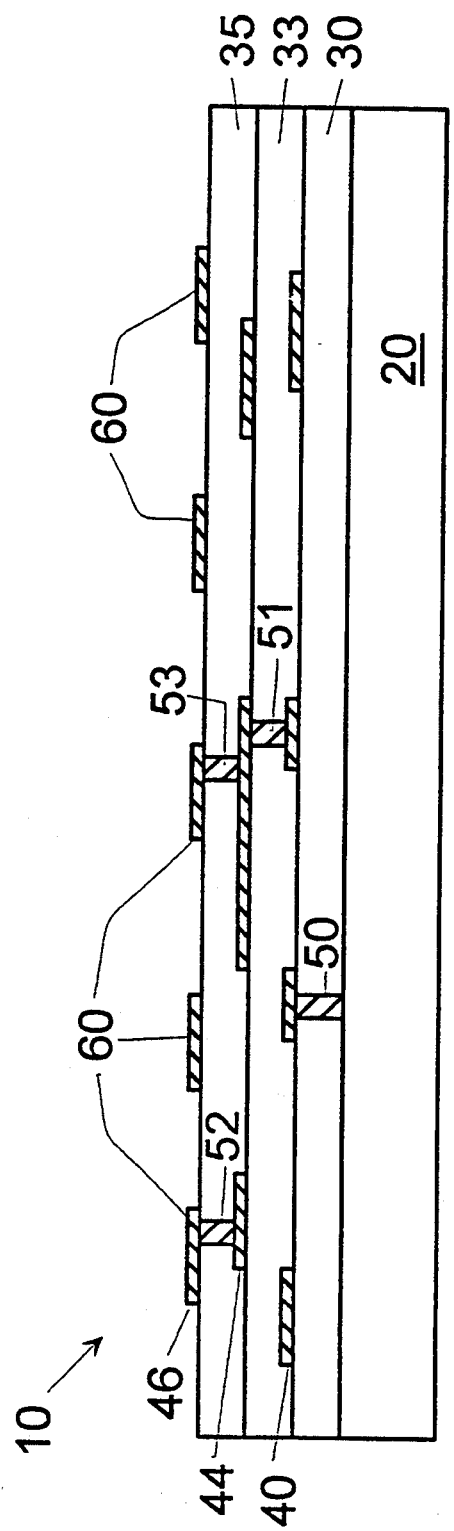
FIG. 1 is a schematic cross-sectional view of a portion of a multilayered substrate used in a multichip module.

FIG. 1 is a schematic cross-sectional view of a multilayered thin-film IC chip module. The present invention is useful in curing the organic dielectric layers used in this module. Chip module 10 comprises a base substrate 20, which may be a plate of metal or ceramic, or a silicon wafer, upon which a plurality of thin film layers are formed. Those skilled in the art will appreciate that FIG. 1 is not drawn to scale and that the substrate 20 will, in reality, be proportionately much thicker than is shown. Likewise, those skilled in the art will recognize that the present invention is particularly useful in connection with a module that has a much larger number of layers than are shown in FIG. 1. For clarity, FIG. 1 is shown with the minimal number of layers believed necessary for illustrative purposes.

Shown in FIG. 1 are three organic dielectric layers 30, 33 and 35. Most commonly, such dielectric layers are made of polyimide, but use of other organic polymeric materials which require curing are considered to be within the scope of the present invention. As is well known in the art, the organic material is typically applied to the uppermost layer upon the substrate in liquid form and spun to achieve a uniform thickness. The thickness of the layer will depend on the viscosity of the liquid, the rotational speed of the spinner, and the manner of application. In the preferred embodiment, layers 30, 33 and 35 have a thickness on the order of 30 $\mu m$, although the present invention is useful with layers which are thinner or thicker than this. As applied, the polyimide is dissolved in a solvent or solvent system, and the viscosity of the liquid mixture may be controlled by adjusting the ratio of the solvent(s) to the polyimide precursors.

After each dielectric layer is formed and cured, a patterned conductive layer is formed on the exposed surface thereof. Typically, the conductive layer is copper. The pattern is formed and the material is applied using standard fabrication techniques, such as photolithography and etch back, well known to those skilled in the art. Prior to forming the metal layer on the exposed surface of a dielectric layer, conductive interconnects or vias between layers may first be formed. Four such vias are shown in FIG. 1, numbered 50, 51, 52 and 53. Again, the vias may be formed using standard, well-known processing techniques to form holes in the dielectric material, and then fill them with conductive material. This may be done by etching and then electroplating. The precise techniques for forming vias are well known to those skilled in the art and need not be discussed further.

After the patterned conductive layer is formed, another dielectric layer is deposited. This process is iterated until the desired number of layers has been fabricated. The uppermost conductive layer 46 comprises a plurality of pads which are used to connect one or more integrated circuit chips (not shown) to module 10. A number of well-known methods are available for making connection between the chip and the module, for example, wirebonding, TAB bonding, C4 bonding, etc. Although not shown because it is not considered to be part of the method of the present invention, a cap layer of passivating material may be placed over the exposed surface of module 10, so as to leave only pads 60 exposed.

Due to topological constraints, when a large number of integrated circuit chips are mounted on module 10, each of which requires power, ground and signal lines, and many of which need to be interconnected to one another, the number of layers required can be quite large. As described above, the traditional method of curing the polyimide layers, by holding each layer at a very high temperature for a long period of time after it is formed, limits the number of layers that can be stacked on top of each other. The present invention is concerned, in part, with overcoming this limitation.

Figure 2:
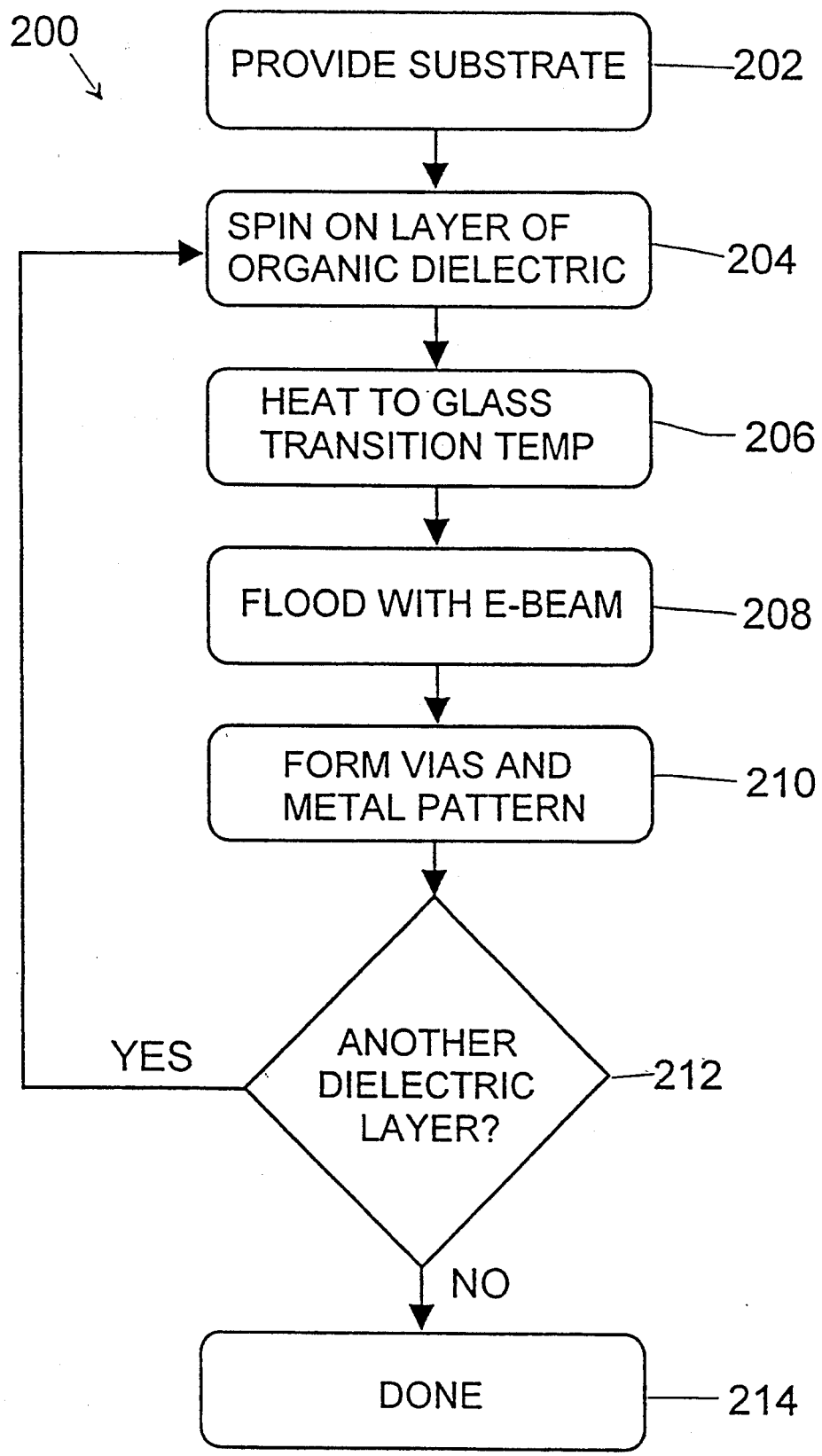
FIG. 2 is a flow chart of the method of the present invention.

According to the present invention, each dielectric layer is cured using a combination of elevated temperature and electron beam (e-beam) irradiation of the layer. Referring to FIG. 2, the process is performed as follows using the sequence of process steps depicted in flow chart 200. Initially, a base substrate is provided (202) and a layer of the desired organic dielectric layer is applied (204), as described above, to achieve a desired uniform thickness which may, for example, be 30 $\mu m$ or more. The layer may be applied by, for example, spinning. The dielectric layer is then heated within an e-beam apparatus (206) and is flood irradiated with the electron beam (208). For polyimide, the temperature of the layer is raised to a temperature of 150°–250° C.

before or during flood irradiation. Heating is accomplished within the vacuum chamber of the e-beam apparatus and may be realized by conventional means such as a hot-plate, an infrared source, or a microwave source. In the preferred embodiment, a heat lamp (infrared source) is used to heat the layer. According to the present invention, the temperature is ramped up to a temperature which is higher than the glass transition temperature of the solvent-free, uncured layer, but which is still well below the glass transition temperature of the cured layer. Using a heat lamp it is possible to raise the temperature of the layer, and its supporting substrate, from room temperature to the desired temperature within 60–120 seconds.

Either while it is being heated to above the glass transition temperature and/or after the layer has reached the proper temperature, the layer of organic dielectric is subjected to a high dosage e-beam. In the preferred embodiment of the present invention, the dose is in the range of 1,000 to 4,000 microcoulomb/cm$^2$ for layers having a thickness in the range of 1–30 μm. This level of irradiation is applied for a relatively short period of time, e.g., 240 seconds. The precise level of radiation applied, the temperature and the duration of the exposure will, of course, vary according to the thickness of the layer being cured and the specific dielectric material that is used.

When cured according to the present invention, two processes are performed on the film. First, the solvent carrier is physically removed, i.e., volatilized, by the elevated temperature of the process. Second, the organic layer is polymerized by the application of an e-beam. These processes are performed in a time span which is far shorter than the curing methods of the prior art.

After the initial layer is cured, vias are formed and a patterned metal layer is applied (210). For each additional dielectric layer that is to be applied, the sequence of steps 204–210 are repeated (212). When the last layer has been applied, the method of the present invention is complete (214), although additional processing of the resulting substrate may be required.

It is noted that the lower temperature used in the present process not only results in films which are high quality, but also reduces the level of stress in the cured films. In particular, as is well known, for a polyimide layer which is heated above its glass transition temperature, the film will be fully relaxed at such temperature. For films that are cured by thermal treatment, the temperature must be kept above the glass transition temperature to ensure that the propagation of polymerization reactions and polycondensation reactions take place at a reasonable rate. As noted above, when thermally curing a layer the glass transition temperature of the film rises as the film undergoes curing, reaching a temperature of above 300° C. for a fully cured polyimide film. If the film is raised to a temperature above the glass transition temperature, the film is fully relaxed at the glass transition temperature and stresses build up as the film is cooled. Thus, the prior art manner of thermally curing the polyimide layer, which involved heating to the highest glass transition temperature, resulted in films which contained considerable stress. In the present invention a much lower temperature is utilized during the curing process, so that the resulting films have much less stress at their operating temperatures. This fact, in turn, reduces the constraints on the choice of substrate material and dimensions, and increases the maximum number of metal/dielectric layers that may be used in the multichip module.

According to the present invention, the temperature of the layer when the e-beam is applied should be at least the glass transition temperature of the uncured material. This is necessary to ensure that the solvent is properly volatilized and rapid and effective polymerization is achieved. Polymerization involves two processes, cross-linking and polycondensation. Both of these processes are best effectuated when the layer is above its glass transition temperature. In effect, when the layer is below its glass transition temperature it is in the solid state, so that the polymer chains have very low mobility within the layer. On the other hand, when heated to a temperature above the glass transition temperature, the layer behaves more like a liquid, such that the molecules have relatively high mobility. Not only does the higher mobility dramatically lower the time necessary for immidization to occur, but it also ensures that complete immidization is achieve. This fact is quite important in obtaining a film with good properties. In particular, the physical and chemical properties of the cured polyimide film, (such as adhesion and chemical resistance) may be seriously degraded if the curing process is incomplete, i.e., if immidization is not complete.

While the present invention has been described in the context of the fabrication of multichip modules, those skilled in the art will appreciate that the inventive technique will be useful in other applications requiring the use of an organic dielectric layer, such as integrated circuit processing, protective overcoating, and passivation of electronic devices.

What is claimed is:

1. A method of curing a thin film of organic dielectric material comprising the steps of:
    (a) applying a thin film of said dielectric material on a base substrate;
    (b) raising said organic dielectric material to an elevated temperature above the glass transition temperature of the uncured material and less than the glass transition of the fully cured material; and
    (c) flood irradiating said material with a flux of electrons while the material is at said elevated temperature.

2. The method of claim 1 wherein said thin film of said dielectric material is at least 30 μm in thickness.

3. The method of claim 2 wherein said elevated temperature is between 150° to 250° C.

4. The method of claim 1 wherein said dielectric material is a polyimide precursor dissolved in a solvent when it is applied to said substrate.

5. The method of claim 1 wherein said step of raising the temperature of said layer and said step of flood irradiating are performed simultaneously.

6. The method of claim 1 wherein said layer is raised to a temperature above the glass transition temperature of the uncured material before the step of flood irradiation is commenced.

7. A method of forming a polyimide layer on an integrated circuit chip carrier, comprising the steps of:
    (a) providing a base substrate,
    (b) applying a uniformly thick liquid layer of a polyimide precursor material dissolved in a solvent on said substrate, (c) raising the temperature of said layer to a temperature above the glass transition temperature of the solvent-free polyimide precursor material and less than the glass transition of the fully cured material, (d) flood irradiating said layer with electrons while the layer is at said raised temperature, such that said layer is cured, and (e) forming a patterned metal film on the exposed surface of said cured layer.

8. The method of claim 7 wherein multiple polyimide layers are formed by repeating the sequence of steps of (b)-(d).

9. The method of claim 7 further comprising the step of forming vias through said cured layer.

* * * * *